United States Patent
Chan et al.

(10) Patent No.: US 8,786,021 B2
(45) Date of Patent: Jul. 22, 2014

(54) SEMICONDUCTOR STRUCTURE HAVING AN ACTIVE DEVICE AND METHOD FOR MANUFACTURING AND MANIPULATING THE SAME

(75) Inventors: Wing-Chor Chan, Hsinchu (TW); Li-Fan Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/603,333

(22) Filed: Sep. 4, 2012

(65) Prior Publication Data

US 2014/0062578 A1    Mar. 6, 2014

(51) Int. Cl.
*H01L 23/62* (2006.01)

(52) U.S. Cl.
USPC .......................................................... 257/355

(58) Field of Classification Search
CPC ................................ H01L 28/20; H01C 7/006
USPC .................. 257/355, 124, 127, 350, 492, 339
See application file for complete search history.

(56) References Cited

U.S. PATENT DOCUMENTS

| | | | | |
|---|---|---|---|---|
| 5,382,825 A * | 1/1995 | Neilson | .......................... | 257/489 |
| 6,110,772 A * | 8/2000 | Takada et al. | ................. | 438/238 |
| 6,310,378 B1 * | 10/2001 | Letavic et al. | ................ | 257/347 |
| 6,344,385 B1 * | 2/2002 | Jun et al. | ........................ | 438/237 |
| 6,472,710 B2 * | 10/2002 | Terashima | .................... | 257/343 |
| 6,525,390 B2 * | 2/2003 | Tada et al. | ..................... | 257/489 |
| 6,768,174 B2 * | 7/2004 | Hasegawa et al. | ............ | 257/350 |
| 6,989,566 B2 * | 1/2006 | Noda et al. | .................... | 257/339 |
| 7,242,062 B2 * | 7/2007 | Okazaki | ........................ | 257/355 |
| 7,306,999 B2 * | 12/2007 | Hall et al. | ..................... | 438/329 |
| 8,395,231 B2 * | 3/2013 | Terashima | .................... | 257/500 |
| 2001/0048122 A1 | 12/2001 | Tada et al. | | |
| 2005/0184338 A1 * | 8/2005 | Huang et al. | .................. | 257/335 |

OTHER PUBLICATIONS

TW Office Action dated May 7, 2014.

* cited by examiner

*Primary Examiner* — Nathan Ha
(74) *Attorney, Agent, or Firm* — McClure, Qualey & Rodack, LLP

(57) ABSTRACT

A semiconductor structure comprising a substrate, an active device, a field oxide layer and a poly-silicon resistor is disclosed. The active device is formed in a surface area of the substrate. The active device has a first doped area, a second doped area and a third doped area. The second doped area is disposed on the first doped area. The first doped area is between the second and the third doped areas. The first doped area has a first type conductivity. The third doped area has a second type conductivity. The first and the second type conductivities are different. The field oxide layer is disposed on a part of the third doped area. The poly-silicon resistor is disposed on the field oxide layer and is electrically connected to the third doped area.

10 Claims, 4 Drawing Sheets

US 8,786,021 B2

SEMICONDUCTOR STRUCTURE HAVING AN ACTIVE DEVICE AND METHOD FOR MANUFACTURING AND MANIPULATING THE SAME

BACKGROUND OF THE INVENTION

1. Field of the Invention

The invention relates in general to a semiconductor device, and method for manufacturing and manipulating the same, and more particularly to a semiconductor device having a combination of an active device and a poly-silicon resistor, and method for manufacturing and manipulating the same.

2. Description of the Related Art

Recently, green power industries are emphasized. The green power industry require higher conversion efficiency and lower standby power consumption. The high voltage process has been widely used for power management integrated circuit (PMIC) and switch mode power supplies (SMPS). SMPS have start-up circuit which requires a wide range of higher input voltage (such as a voltage from 40 Volt to 750 Volt).

The switch mode power IC requires to integrate a start-up circuit and a pulse width modulation (PWM) circuit. Generally, a start-up circuit of a high voltage device utilizes a resistor for providing a charging current to a capacitor. The start-up circuit stops working until the voltage of the capacitor reaches a start-up voltage of the PWM circuit. Conventionally, a power resistor is utilized in a traditional high voltage start-up circuit. Therefore, power would be continuously consumed by the power resistor, even though the start-up circuit stops working. Thus, the traditional high voltage start-up circuit can not achieve an energy saving effect.

SUMMARY OF THE INVENTION

The invention is directed to a semiconductor structure and method for manufacturing and manipulating the same. The semiconductor structure combines an active device and a poly-silicon resistor so that a result of volume reduction can be achieved. Besides, the semiconductor structure can be produced easily without additional complex process.

According to one aspect of the present invention, a semiconductor structure comprising a substrate, an active device, a field oxide layer and a poly-silicon resistor is disclosed. The active device is formed in a surface area of the substrate. The active device has a first doped area, a second doped area and a third doped area. The second doped area is disposed on the first doped area. The first doped area is between the second and the third doped areas. The first doped area has a first type conductivity. The third doped area has a second type conductivity. The first and the second type conductivities are different. The field oxide layer is disposed on a part of the third doped area. The poly-silicon resistor is disposed on the field oxide layer and is electrically connected to the third doped area.

According to a another aspect of the present invention, a method of manufacturing a semiconductor structure is disclosed. The method comprises following steps. A substrate is provided. An active device in a surface area of the substrate is formed. The active device has a first doped area, a second doped area and a third doped area. The second doped area is disposed on the first doped area, the first doped area is disposed between the second and the third doped area. The first doped area has a first type conductivity, the third doped area has a second type conductivity, the first type conductivity and the second type conductivity are different. A field oxide layer on a part of the third doped area is formed. A poly-silicon resistor on the field oxide layer is formed, and the poly-silicon resistor and the third doped area are electrically connected.

According to still another aspect of the present invention, a method of manipulating a semiconductor structure is disclosed. The semiconductor structure comprises a substrate, an active device, a field oxide layer and a poly-silicon resistor. The active device comprises a gate, a drain and a source. The field oxide layer is disposed on a part of the active device. The poly-silicon resistor comprises a plurality of electrical connecting terminals. The method comprises following steps. A gate voltage to the gate is applied, a drain voltage to the drain is applied and a source voltage to the source is applied. One of the electrical connecting terminals to the drain is coupled. Another one of the electrical connecting terminals to a reference voltage is coupled. Still another one of the electrical connecting terminals to a ground terminal is coupled. A voltage potential difference exist between the another one of the electrical connecting terminals and the still another one of the electrical connecting terminals.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
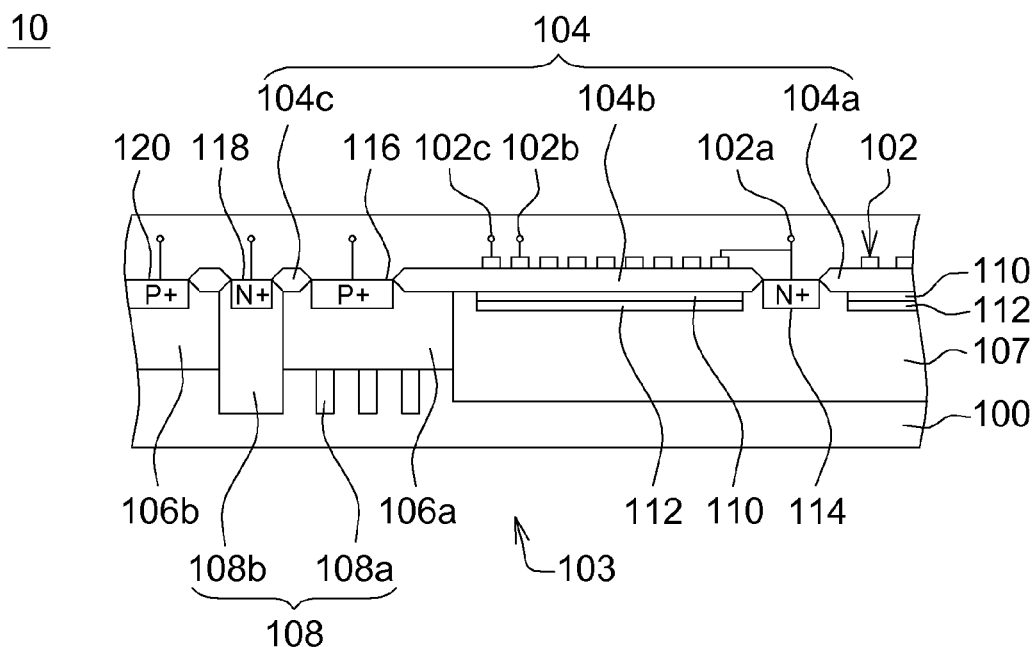
FIG. 1 are cross-sectional views showing a semiconductor structure according to one embodiment.

FIG. 1 illustrates a semiconductor structure according to one embodiment of the invention. Referring to FIG. 1, the semiconductor structure 10 comprises a substrate 100, an active device 103 formed in a surface area of the substrate 100, such as a silicon substrate. The substrate 100 has a first conductivity, for example a p type conductivity. The active device 103 has a doped area 106a, a doped area 106b, a doped area 107, a plurality of doped areas 108a, a doped area 108b, a doped area 110, a doped area 112, a doped area 114, a doped area 116, a doped area 118 and a doped area 120. The doped area 116 is disposed on the doped area 106a. The doped area 106a is disposed between the doped area 107 and the doped area 116.

The doped area 106a, the doped area 106b, the doped area 112, the doped area 116 and the doped area 120 have a first type conductivity, the doped area 107, the doped areas 108a, the doped area 108b, the doped area 110, the doped area 114 and the doped area 118 have a second type conductivity, the first type and the second type conductivities are different. For example, the first type conductive doped area are doped with p type conductive ions such as boron. The second type conductive doped area are doped with n type conductive ions such as arsenic or phosphorus.

In one embodiment, the doped area 114, the doped area 116, the doped area 118 and the doped area 120 are heavily doped areas having heavily doped ions. The doped area 106a, the doped area 106b, the doped area 107, the doped areas 108a and the doped area 108b are lightly doped areas having light doped ions. In one embodiment, the doped area 106a and the doped area 106b are wells having a first type conductivity, such as p type wells. The doped area 107 is a high voltage well, such as a high voltage n type well. The doped areas 108a and the doped area 108b are deep well, such as a n type deep well. The doped areas 108a and the doped area 108b are disposed adjacent to the doped area 106a. For example, the doped areas 108a and the doped area 108b are disposed at a bottom side and a lateral side of the doped area 106a, respectively. The doped areas 108a and the doped area 108b have the second conductivity. A distance between the doped areas 108a and a number of the doped areas 108a are related to a pinch-off voltage of the active device 103. A distance between two doped areas 108a and a distance between the doped areas 108a and the doped area 108b are related to the pinch-off voltage of the active device 103.

The doped area 110 and the doped area 112 are formed in the doped area 107. The doped area 110 is for example a first top doped area and the doped area 112 is for example a second top doped area. The conductivity of the first and the second doped area are different. In one embodiment, the doped area 110 has a second type conductivity and the doped area 112 has a first type conductivity. In another embodiment, the doped area 110 has a first type conductivity and the doped area 112 has a second type conductivity. In one embodiment, the doped area 114 in FIG. 1 is for example a drain region, the doped area 116 is for example a gate, and the doped area 118 is for example a source region. The doped area 120 is for example a bulk region, The field oxide structure 104 comprises a field oxide layer 104a, a field oxide layer 104b and a field oxide layer 104c. The field oxide layer 104a and the field oxide layer 104b are formed and disposed on a part of the doped area 107. The poly-silicon resistor 102 is formed and disposed on the field oxide 104a and the field oxide 104b.

The poly-silicon resistor 102 comprises a plurality of segments, the segments are corresponding to a plurality of electrical connecting terminals, such as electrical connecting terminal 102a, electrical connecting terminal 102b and electrical connecting terminal 102c. The electrical connecting terminal 102b can be used for connecting to an internal circuit (which has a reference voltage). The electrical connecting terminal 102c can be used for connecting to a ground terminal. A divider resistance exist between the electrical connecting terminal 102b and electrical connecting terminal 102c. When manipulating the semiconductor structure 10, a gate voltage is applied to the gate, a drain voltage is applied to the drain and a source voltage is applied to the source. Besides, the electrical connecting terminal 102b is coupled to a reference voltage, the electrical connecting terminal 102c is coupled to a ground terminal with a ground voltage. Since a divider resistance exists between the electrical connecting terminal 102b and the electrical connecting terminal 102c, a voltage difference exists between the electrical connecting terminal 102b and the electrical connecting terminal 102c.

In one embodiment, the active area 103 is for example a high voltage device. In particular, the active device 103 is for example but not limited to a n type junction gate field-effect transistor (NJFET). In one embodiment, the active device 103 can be manufactured by applying a local oxidation of silicon (LOCOS) process, an EPI process, a non-EPI process, a field oxidation (FOX) process, a shallow trench isolation (STI) process, a deep trench isolation (DTI) process and/or silicon-on-insulator (SOI) process.

The outline of the active device 103 can be circle structures, ellipse structures or octagon structures or other possible structures. In one embodiment, a second type conductive buried layer (such as a n type buried layer) is used for a channel of the NJFET. In one embodiment, the n type channel can be formed from n type well, n type drift region, n type buffer layer and/or n type deep well. The pinch-off voltage of the NJFET can be adjust by adjusting the distance between the n type buried layer.

The semiconductor structure 10 combines the poly-silicon 102 and the active device 103. For example, the poly-silicon resistor 102 is embedded in a field oxide layer of the doped area 107 (such as a drift region). The volume of the semiconductor structure can be reduced and the semiconductor structure can be produced by high voltage process without additional mask process. Besides, the embedded poly-silicon resistor 102 can be high resistance resistors and can be applied in voltage division circuit and voltage reduce circuit.

Figure 2A:
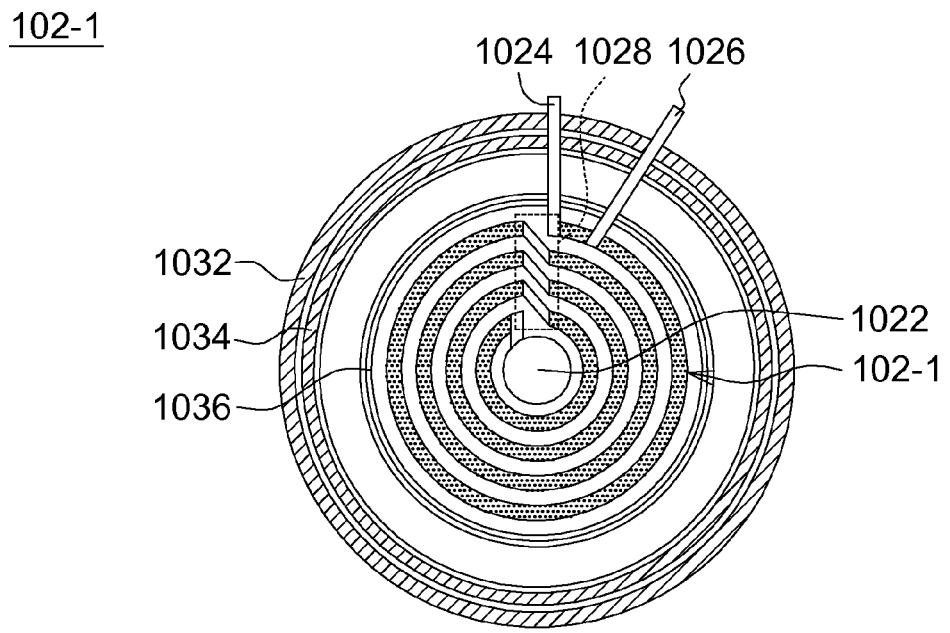
FIGS. 2A~2E are top views of different semiconductor structures embodiment for according to FIG. 1 of the invention.

FIG. 2A illustrates a top view of the semiconductor structure of FIG. 1 according to one embodiment of the invention. Referring to FIG. 2A, the poly-silicon resistor 102-1 is one embodiment of the poly-silicon resistor 102 in FIG. 1. The poly-silicon resistor 102-1 can comprise a plurality of concentric circulars or concentric circles with different radius of curvature. In other embodiments, the poly-silicon resistor 102-1 can be but not limited to octagon structures (such as octagon ring-shaped structures), a plurality of half circular structures, a plurality of elliptical circular structures or irregular semicircle structures. The poly-silicon resistor 102-1 can be formed by first forming a poly-silicon material on the field oxide layer 104 (shown in FIG. 1) and then patterning the poly-silicon material into the half circular structures, the elliptical circular structures, irregular semicircle structures, the concentric circular structures, the concentric circle structures or the octagon structures.

Referring to FIGS. 1 and 2A, the doped area 114 of FIG. 1 is corresponding to the area 1022 (such as the drain region) of FIG. 2A. The area 1022 can comprises a contact. The doped area 116 is corresponding to the area 1036 (such as the gate region) of FIG. 2A. The doped area 118 is corresponding to the area 1034 (such as the source region) of FIG. 2A. The doped area 120 is corresponding to the area 1032 (such as the base region) of FIG. 2A.

In this embodiment, the poly-silicon resistor 102-1 can have a plurality of half circular structures, half-ring shaped structures, irregular semicircle structures, a plurality of concentric circle structures, a plurality of concentric circular structures or a plurality of octagon surrounding the drain. The poly-silicon resistor 102-1 has an opening area 1028. The opening area comprises a plurality of conductivity layer. The conductivity layer can comprise metal segments or poly-silicon segments for connecting each ring of the poly-silicon resistor 102-1 to the next ring of the poly-silicon resistor 102-1.

The poly-silicon resistor 102-1 can be electrically connected to the ground terminal by a conductive layer 1024 and can be electrically connected to the internal circuit (which has a reference voltage) by a conductive layer 1026. The conductive layer 1024 and the conductive layer 1026 can comprise metal, poly-silicon or other conductive materials. A part of the poly-silicon resistor 102-1 between the conductive layer 1024 and the conductive layer 1026 can be a divider resistance. The resistances of the divider resistance and the outmost part of the poly-silicon resistor 102-1 taking out the divider resistance can be represent by a ratio relationship. For example, the resistances of the divider resistance is R, the resistances of the outmost part of the poly-silicon resistor 102-1 taking out the divider resistance is 100R, the ratio relationship is 1:100.

Figure 2B:
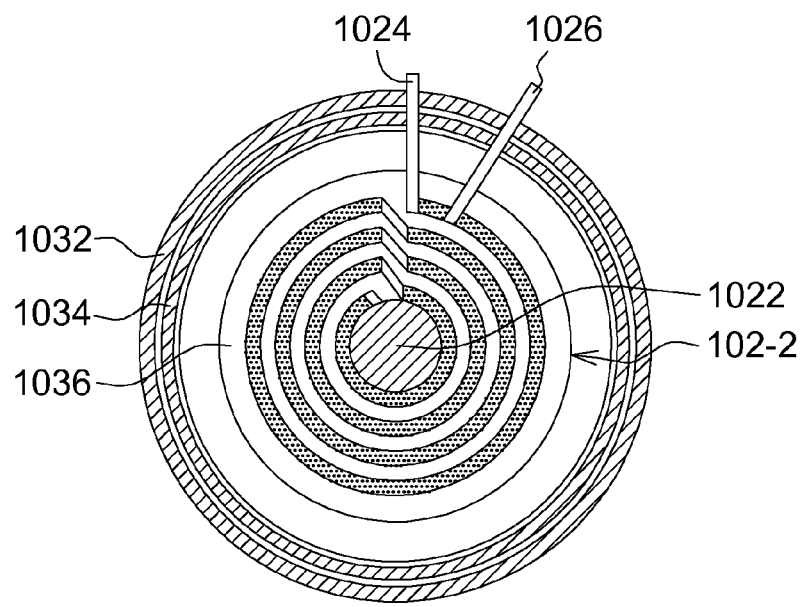

FIG. 2B illustrates a top view of the semiconductor structure of FIG. 1 according to one embodiment of the invention. Referring to FIG. 2B, the poly-silicon resistor 102-2 is another embodiment of the poly-silicon resistor 102 of FIG. 1. The structure, material, shape, forming method and manipulating method of poly-silicon resistor 102-2 can be similar to the structure, material, shape, forming method and manipulating method of poly-silicon resistor 102-1. The difference between the poly-silicon resistor 102-1 and poly-silicon resistor 102-2 is that the poly-silicon resistor 102-2 having a large metal field plate for reducing the electric field effect.

Figure 2C:
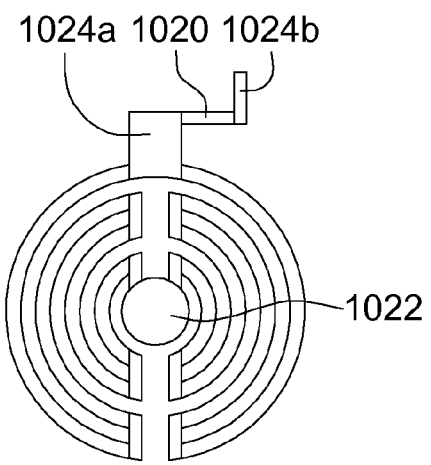

FIG. 2C illustrates a top view of the semiconductor structure of FIG. 1 according to one embodiment of the invention. Referring to FIG. 2C, the poly-silicon resistor 102-3 is one embodiment of the poly-silicon resistor 102 in FIG. 1. The poly-silicon resistor 102-3 can comprise a plurality of concentric half circulars or half rings symmetrically or mirror-imagined disposed relative to the area 1022 (such as a drain region) to arrange into a plurality of circular-liked structures. The poly-silicon resistor 102-3 can be formed by ways similar to the method for manufacturing the poly-silicon resistor 102-1 of FIG. 2A. Two neighboring concentric half circulars of the concentric half circulars disposed at the same side relative to the area 1022 are electrically connected by metal, poly-silicon or other conductivity materials.

In this embodiment, the same ring of the poly-silicon resistor 102-3 is equipotential. Besides, the outmost ring of the poly-silicon resistor 102-3 can be connected to another poly-silicon resistor 1020 by a conductive layer 1024a. The poly-silicon resistor 1020 can be further connected to a ground terminal by a conductive layer 1024b. Therefore, the resistance characteristic of poly-silicon resistor 102-3 can be controlled more specifically.

The poly-silicon resistor 102-3 shown in FIG. 2C illustrates but not limited to a concentric circular structures comprising a plurality of half circular with different radius of curvature. In other embodiments, the poly-silicon resistor 102-3 can be elliptical structures, concentric circle or octagon structures.

Figure 2D:
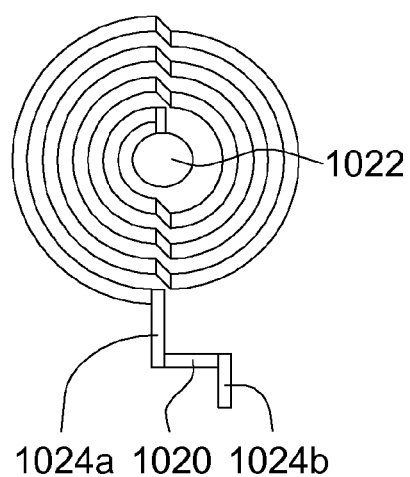

FIG. 2D illustrates a top view of the semiconductor structure of FIG. 1 according to one embodiment of the invention. Referring to FIG. 2D, the poly-silicon resistor 102-4 is one embodiment of the poly-silicon resistor 102 in FIG. 1. The poly-silicon resistor 102-4 can comprise an irregular semicircle structures surrounding the area 1022 (such as a drain region). Each ring of the irregular semicircle structures shift when curving so that the layout process can be simpler. In this embodiment, the voltage potentials of each ring in the irregular semicircle structures are different. A distance of each ring of the poly-silicon resistor 102 can be enlarged to prevent the dramatic voltage drop. Besides, the operation of conductive layer 1024a, the another poly-silicon resistor 1020 and the conductive layer 1024b is used for controlling the poly-silicon resistor 102-4 more specifically and is described advanced in FIG. 2C.

Figure 2E:
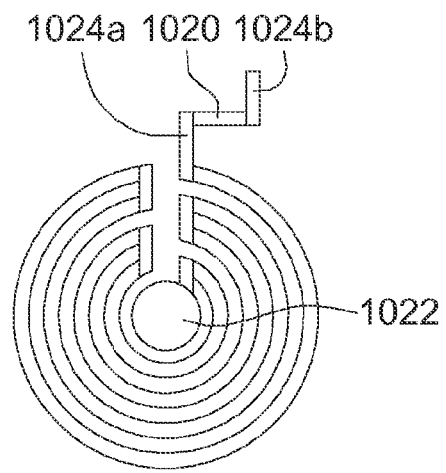

FIG. 2E illustrates a top view of the semiconductor structure of FIG. 1 according to one embodiment of the invention. Referring to FIG. 2E, the poly-silicon resistor 102-5 is one embodiment of the poly-silicon resistor 102 in FIG. 1. The poly-silicon resistor 102-5 can comprise a plurality of curved concentric circulars or half rings surrounding the area 1022 (such as a drain region) to arrange into a plurality of circular-liked structures. The poly-silicon resistor 102-5 can be formed by ways similar to the method for manufacturing the poly-silicon resistor 102-1 of FIG. 2A. The operation of conductive layer 1024a, the another poly-silicon resistor 1020 and the conductive layer 1024b is used for controlling the poly-silicon resistor 102-5 more specifically and is described advanced in FIG. 2C.

The poly-silicon resistor 102-5 in FIG. 2E is illustrate as but not limited to a concentric circular structures. In other embodiments, the poly-silicon resistor 102-5 can be an elliptical structures or an octagon ring structure.

Second Embodiment

Figure 3:
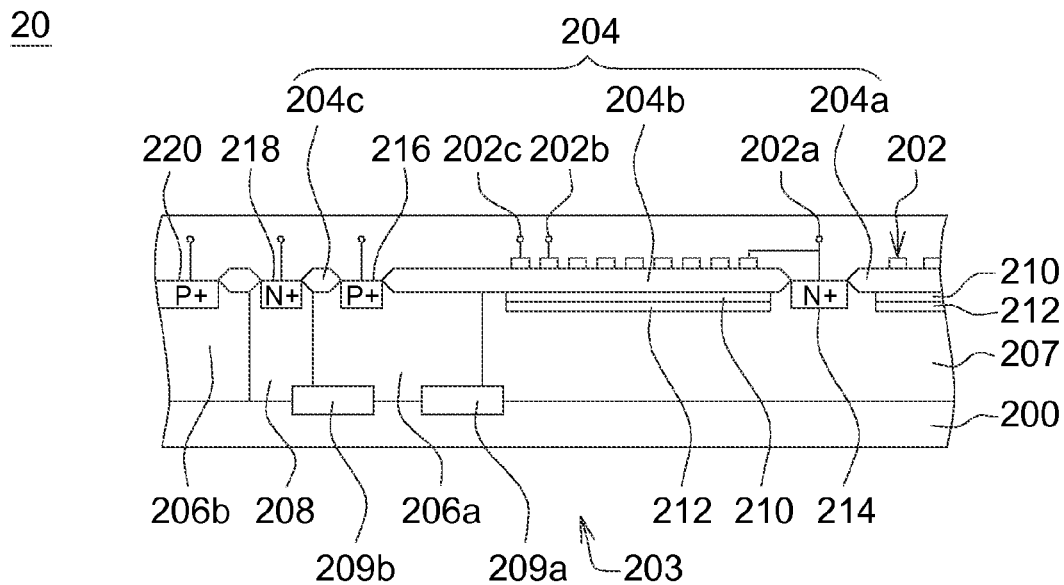
FIG. 3 shows another semiconductor structure according to another one embodiment.

FIG. 3 illustrates a semiconductor structure according to one embodiment of the invention. Referring to FIG. 3, the semiconductor structure 20 comprises a substrate 200, an active device 203 formed in a surface area of the substrate 200, such as a silicon substrate. The substrate 200 has a first conductivity, for example a p type conductivity. The active device 203 has a doped area 206a, a doped area 206b, a doped area 207, a plurality of doped area 208, a doped area 209a, a doped area 209b, a doped area 210, a doped area 212, a doped area 214, a doped area 216, a doped area 218 and a doped area 220. The doped area 216 is disposed on the doped area 206a. The doped area 206a is disposed between the doped area 207 and the doped area 216.

The doped area 206a, the doped area 206b, the doped area 212, the doped area 216 and the doped area 220 have a first type conductivity, the doped area 207, the doped area 208 the doped area 210, the doped area 214 and the doped area 218 have a second type conductivity, the first type and the second type conductivities are different. For example, the first type conductive doped area are doped with p type conductive ions and the second type conductive doped area are doped with n type conductive ions.

In one embodiment, the doped area 214, the doped area 216, the doped area 218 and the doped area 220 are heavily doped areas having heavily doped ions. The doped area 206a, the doped area 206b, the doped area 207 and the doped area 208 are lightly doped areas having light doped ions. In one embodiment, the doped area 206a and the doped area 206b are high voltage deep wells having a first type conductivity, such as p type deep wells. The doped area 207 is a high voltage well, such as a high voltage n type well. The doped area 208 is disposed adjacent to the doped area 206a. For example, the doped area 208 is disposed at a lateral side of the doped area 206a. The doped area 209a and the doped area 209b are disposed at the bottom side of the doped area 206a. The doped area 209a and the doped area 209b can be n type buried layers. A distance between the doped area 209a and the doped area 209b is related to a pinch-off voltage of the active device 203. The doped area 210 and the doped area 212 can be similar to the doped area 110 and the doped area 112.

The field oxide structure 204 comprises a field oxide layer 204a, a field oxide layer 204b and a field oxide layer 204c. The field oxide layer 204a and the field oxide layer 204b are formed and disposed on a part of the doped area 207. The poly-silicon resistor 202 is formed and disposed on the field oxide layer 204a and the field oxide layer 204b, and can comprise the structures of embodiments illustrate in FIGS. 2A~2E. The poly-silicon resistor 202 comprises a plurality of segments, the segments are corresponding to a plurality of electrical connecting terminals, such as electrical connecting terminal 202a, electrical connecting terminal 202b and electrical connecting terminal 202c. The electrical connecting terminal 202a~202c can be similar to the electrical connecting terminal 101a~101c of FIG. 1.

In one embodiment, the active device 203 is for example a high voltage device. In particular, the active device 203 is for example but not limited to a n type junction gate field-effect transistor (NJFET). In one embodiment, the active device 203 can be manufactured by process similar to process for manufacturing the active device 103 of FIG. 1. The active device 203 can be other semiconductors. In one embodiment, the second type conductive buried layer 209a and the second type conductive buried layer 209b (such as n type buried layers) can be used as the channel of the NJFET. The pinch-off voltage can be adjusted by adjusting the distance between the n type buried layers.

The semiconductor structure 20 combines the poly-silicon 202 and the active device 203. For example, the poly-silicon resistor 202 is embedded in a field oxide layer of the doped area 207 (such as a drift region). The volume of the semiconductor structure can be reduced and the semiconductor structure can be produced by high voltage process without additional mask process. Besides, the embedded poly-silicon resistor 202 can be high resistance resistors and can be applied in voltage division circuit and voltage reduce circuit.

Third Embodiment

Figure 4:
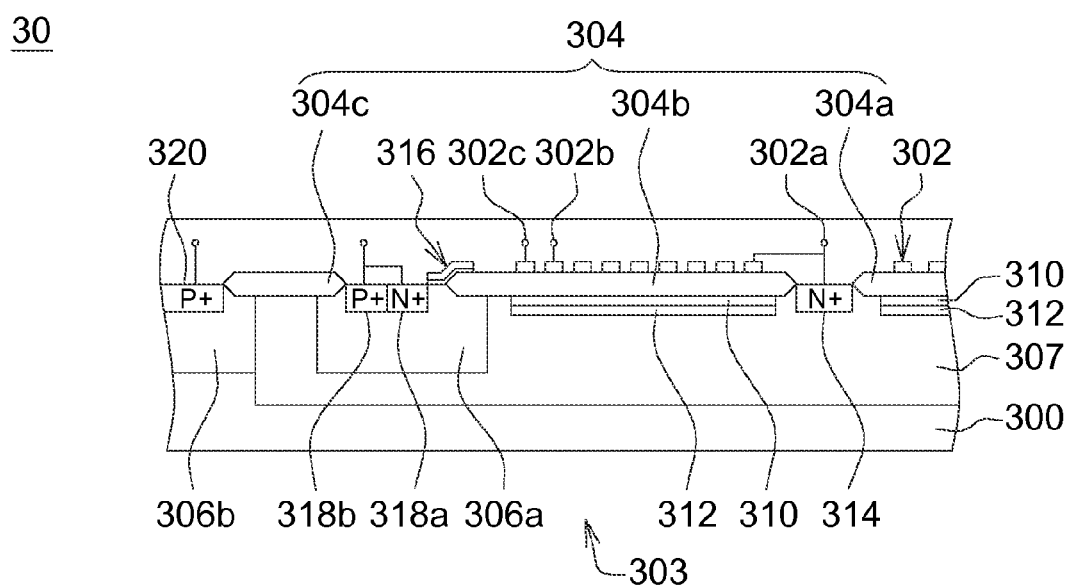
FIG. 4 shows still another semiconductor structure according to still another one embodiment.

FIG. 4 illustrates a semiconductor structure according to one embodiment of the invention. Referring to FIG. 4, the semiconductor structure 30 comprises a substrate 300, an active device 303 formed in a surface area of the substrate 300, such as a silicon substrate. The substrate 300 has a first conductivity, for example a p type conductivity. The active device 303 has a doped area 306a, a doped area 306b, a doped area 307, a plurality of doped area 310, a doped area 312, a doped area 314, a doped area 318a, a doped area 318b and a doped area 320. The doped area 318a and the doped area 318b are disposed on the doped area 306a. The doped area 306a is disposed between the doped area 307 and the doped area 318a and the doped area 318b.

The doped area 306a, the doped area 306b, the doped area 312, the doped area 318b and the doped area 320 have a first type conductivity, the doped area 307, the doped area 310, the doped area 314 and the doped area 318a have a second type conductivity, the first type and the second type conductivities are different. For example, the first type conductive doped area are doped with p type conductive ions and the second type conductive doped area are doped with n type conductive ions.

In one embodiment, the doped area 314, the doped area 318a, the doped area 318b and the doped area 220 are heavily doped areas having heavily doped ions. The doped area 306a, the doped area 306b, the doped area 307 are lightly doped areas having light doped ions. In one embodiment, the doped area 306a and the doped area 306b are wells having a first type conductivity, such as p type wells. The doped area 307 is a high voltage well having a second type conductivity, such as a high voltage n type well. The doped area 310 and the doped area 312 can be similar to the doped area 110 and the doped area 112 of FIG. 1.

The field oxide structure 304 comprises a field oxide layer 304a, a field oxide layer 304b and a field oxide layer 304c. The field oxide layer 304a and the field oxide layer 304b are formed and disposed on a part of the doped area 307. The poly-silicon resistor 302 is formed and disposed on the field oxide layer 304a and the field oxide 304b, and can comprise the structures of embodiments illustrate in FIGS. 2A~2E. The poly-silicon resistor 302 comprises a plurality of segments, the segments are corresponding to a plurality of electrical connecting terminals, such as electrical connecting terminal 302a, electrical connecting terminal 302b and electrical connecting terminal 302c. The electrical connecting terminal 302a~302c can be similar to the electrical connecting terminal 102a~102c of FIG. 1.

In one embodiment, the active area 303 is for example a high voltage device. In particular, the active device 303 is for example but not limited to a n type laterally diffused metal oxide semiconductor (LDMOS). In one embodiment, the active device 303 can be manufactured by ultra high voltage (UHV) process. The doped area 314 can be a drain region, the gate structure 316 can be a gate region comprises a gate layer and a gate oxide layer. The doped area 318a and the doped area 318b can be electrically connected source region and base region. In other embodiment, the active device 303 can be other semiconductor devices.

The semiconductor structure 30 combines the poly-silicon resistor 302 and the active device 303. For example, the poly-silicon resistor 302 is embedded in a field oxide layer of the doped area 307 (such as a drift region). The volume of the semiconductor structure can be reduced and the semiconductor structure can be produced by high voltage process without additional mask process. Besides, the embedded poly-silicon resistor 302 can be high resistance resistors and can be applied in voltage division circuit and voltage reduce circuit.

The semiconductor structures in the embodiments of the invention can combine the poly-silicon resistor and the active device, and can be applied to a high voltage semiconductor structure. Therefore, the volume of the semiconductor structure can be reduced and the semiconductor structure can be manufacturing by high voltage process without additional mask process. Besides, the embedded poly-silicon resistor 302 can be high resistance resistors and can be applied in voltage division circuit and voltage reduce circuit.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   an active device, formed in a surface area of the substrate, the active device having a first doped area, a second doped area and a third doped area, wherein the second doped area is disposed on the first doped area, the first doped area is disposed between the second and the third doped area, the first doped area has a first type conductivity, the third doped area has a second type conductivity and a drain, the first type conductivity and the second type conductivity are different;
   a field oxide layer, disposed on a part of the third doped area; and
   a poly-silicon resistor, disposed on the field oxide layer and electrically connected to the third doped area and coupled to a ground terminal, wherein the poly-silicon resistor comprising at least three electrical connecting terminals, the at least three electrical connecting terminals coupled to the drain, an internal circuit and the ground terminal, respectively.

2. A semiconductor structure according to claim 1, wherein the first doped area comprises a first light doped area having the first type conductivity, the second doped area is a first heavily doped area having one of the first and the second type conductivities, and the third doped area comprises a second light doped area and a second heavily doped area, the second light doped area and the second heavily doped area have the second type conductivity.

3. A semiconductor structure according to claim 1, wherein the poly-silicon resistor is electrically connected to an internal circuit and a ground terminal, the poly-silicon resistor has a plurality of half-circular structures, a plurality of elliptical structures, a plurality of irregular semicircle structures, a plurality of concentric circle structures or a plurality of octagon structures.

4. A semiconductor structure according to claim 3, wherein the second heavily doped area is the drain, the half-circular structures, the elliptical structures, the irregular semicircle structures, the concentric circle structures or the octagon structures encircle the drain.

5. A semiconductor structure according to claim 4, wherein the half-circular structures, the elliptical structures or the concentric circle structures comprise a plurality of ring-shaped structures with different curvatures.

6. A semiconductor structure according to claim 4, wherein the half-circular structures comprise a plurality of first concentric half rings with different radius and a plurality of second concentric half rings with different radius, the first and the second half rings are symmetrically disposed or mirror-imaged disposed relatively to the drain, two neighboring half rings of the first half rings are electrically connected, and two neighboring half rings of the second half rings are electrically connected.

7. A semiconductor structure according to claim 6, wherein the two neighboring first half rings and the two neighboring second half rings are electrically connected by a metal material or a poly-silicon material.

8. A semiconductor structure according to claim 1, further comprising a plurality of buried layers disposed between the first doped area and the substrate, wherein the buried layers has a second type conductivity, and a distance between two of the buried layers is related to a pinch-off voltage of the active device.

9. A semiconductor structure according to claim 1, further comprising a plurality of fourth doped areas disposed adjacent to the first doped area, wherein the fourth doped areas have the second type conductivity, and a distance between the fourth doped areas is related the a pinch-off voltage of the active device.

10. A semiconductor structure according to claim 9, wherein the second doped area is coupled to a gate voltage, and a part of the fourth doped areas is coupled to a source voltage.

* * * * *